United States Patent
Kirsch et al.

(10) Patent No.: US 9,823,321 B2
(45) Date of Patent: Nov. 21, 2017

(54) METHOD AND APPARATUS FOR ACQUISITION OF MAGNETIC RESONANCE DATA WITH FAT SATURATION PULSES RADIATED WITH RESPECTIVELY DIFFERENT FLIP ANGLES

(71) Applicants: John Kirsch, Charlestown, MA (US); Dominik Paul, Bubenreuth (DE); Benjamin Schmitt, Mosman (AU)

(72) Inventors: John Kirsch, Charlestown, MA (US); Dominik Paul, Bubenreuth (DE); Benjamin Schmitt, Mosman (AU)

(73) Assignee: Siemens Aktiengesellschaft, Munich (DE)

( * ) Notice: Subject to any disclaimer, the term of this patent is extended or adjusted under 35 U.S.C. 154(b) by 765 days.

(21) Appl. No.: 14/219,239

(22) Filed: Mar. 19, 2014

(65) Prior Publication Data
US 2015/0268319 A1 Sep. 24, 2015

(51) Int. Cl.
| | |
|---|---|
| G01R 33/483 | (2006.01) |
| G01R 33/561 | (2006.01) |
| G01R 33/56 | (2006.01) |
| G01R 33/48 | (2006.01) |

(52) U.S. Cl.
CPC ..... *G01R 33/4835* (2013.01); *G01R 33/5607* (2013.01)

(58) Field of Classification Search
CPC ............ G01R 33/4833; G01R 33/4835; G01R 33/5607; G01R 33/5615; G01R 33/4828
See application file for complete search history.

(56) References Cited

U.S. PATENT DOCUMENTS

| | | | | |
|---|---|---|---|---|
| 2008/0224697 | A1* | 9/2008 | Saranathan | G01R 33/4818 324/307 |
| 2010/0156418 | A1* | 6/2010 | Abe | A61B 5/055 324/310 |
| 2011/0267053 | A1* | 11/2011 | Li | G01R 33/5617 324/309 |

\* cited by examiner

*Primary Examiner* — Melissa Koval
*Assistant Examiner* — Rishi Patel
(74) *Attorney, Agent, or Firm* — Schiff Hardin LLP

(57) ABSTRACT

In a method and apparatus for magnetic resonance imaging of an examination subject using an acquisition sequence that includes at least one acquisition cycle, wherein the acquisition cycle includes a readout block set with at least two readout blocks, and a saturation pulse set with at least two saturation pulses, the saturation pulses of the saturation pulse set are respectively associated with respective readout blocks of the readout block set, and the saturation pulses of the saturation pulse set have respectively varying flip angles.

7 Claims, 3 Drawing Sheets

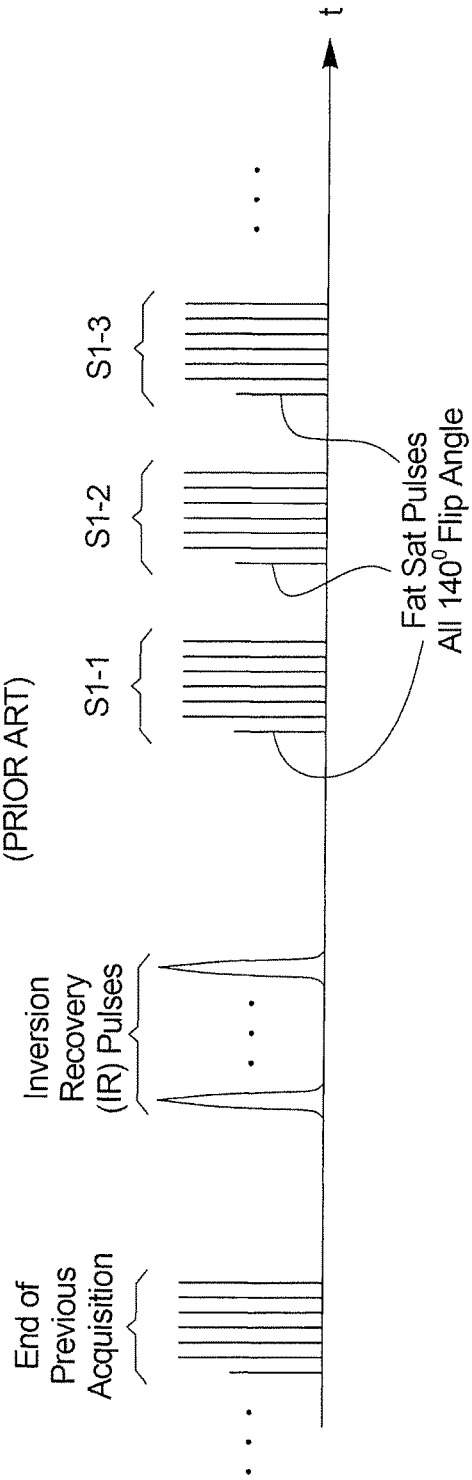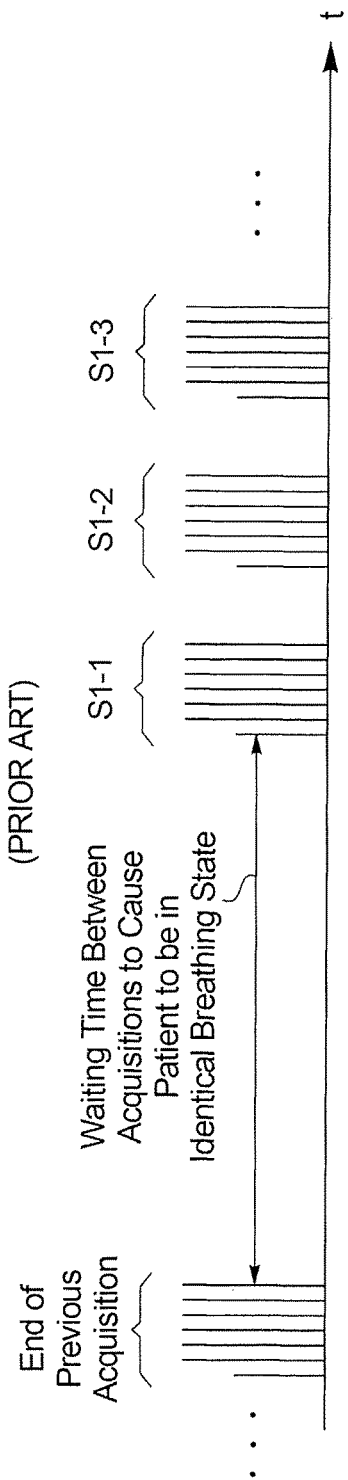

METHOD AND APPARATUS FOR ACQUISITION OF MAGNETIC RESONANCE DATA WITH FAT SATURATION PULSES RADIATED WITH RESPECTIVELY DIFFERENT FLIP ANGLES

BACKGROUND OF THE INVENTION

Field of the Invention

The present invention concerns methods and systems for acquiring magnetic resonance data, and in particular to methods and systems wherein at least one radio-frequency (RF) pulse is radiated that saturates the magnetization of nuclear spins of fat in a data acquisition region of an examination subject. Sequences or protocols for operating a magnetic resonance apparatus known as TIRM (Turbo Inversion Recovery with a Magnitude display) protocols provide an image with a contrast, which is becoming more popular, for example, for spine imaging. Ideally, when multiple images are combined in a stack in order to collectively produce an image of an anatomical feature such as the spine, each image in the stack should have the same fat saturation, so that when the reconstructed images are displayed, the combined stack does not exhibit differences from slice-to-slice, which detract from the diagnostic quality of the overall image.

Description of the Prior Art

In conventional techniques for data acquisition for this type of image, however, the fat saturation is not homogenous for the entire slice stack.

This is because of the nature of the conventional imaging sequences that are used for this purpose. An example of such a known sequence is shown in FIG. 1 with a sequence proceeding from left to right with increasing time t. After the end of a data acquisition (readout), inversion recovery (IR) pulses are radiated to invert the nuclear spins that existed at the end of the previous acquisition. In the next acquisition, data are read out for different slices S1-1, S1-2, S1-3, etc., from echo trains, each preceded by a fat saturation (FatSat) pulse, which has a flip angle of 140°. A waiting time (inversion time), which typically is approximately 900 to 1,000 ms occurs before data from the first slice is acquired. This type of sequence is known as an interleaved inversion recovery sequence. The radiation of the FatSat pulse prior to each slice acquisition suppresses fat signals originating from the tissue from which the data are acquired.

The flip angle of the FatSat pulse depends on the repetition time thereof, and thus applying the same FatSat pulse (i.e., a FatSat pulse with the same flip angle of 140°) results in the fat signal that occurs being different in different slices.

A similar situation occurs in triggered TSE (Turbo Spin Echo) scans, as shown in the known sequence illustrated in FIG. 2. In such scans, one echo train per slice, for several slices, is detected after a waiting time, defined by the breathing cycle of the patient, in order for the data to be acquired in each acquisition with the patient in the identical breathing state. Due to the necessary waiting time between the successive data acquisitions, the FatSat pulse for the first slices is less effective than for the later slices.

SUMMARY OF THE INVENTION

An object of the present invention is to improve image acquisition procedures of the type described above, by making the fat saturation that occurs in each slice acquisition, in a multi-slice acquisition procedure, more uniform from slice acquisition-to-slice acquisition, so that when the slices in a stack are combined and displayed, the contrast appearance in the overall displayed image, so that the same detected contrast in each slice is represented with the same visual appearance (darkness or lightness) in the displayed image.

This object is achieved in accordance with the present invention by a method and apparatus for data acquisition wherein a set of respective FatSat pulses are individually radiated prior to data acquisition for respective slices of a stack have different flip angles, beginning with a higher flip angle and decreasing toward the conventional flip angle of 140°. The stack constitutes a readout block set, with data for each slice being a readout block. The number of decrementing steps can be varied, as can the number of subsequent pulses that then follow with the same flip angle.

BRIEF DESCRIPTION OF THE DRAWINGS

FIG. 1, as noted above, exhibits a known TIRM sequence.

FIG. 2, as noted above, illustrates a known triggered TSE sequence.

DESCRIPTION OF THE PREFERRED EMBODIMENTS

Figure 3:
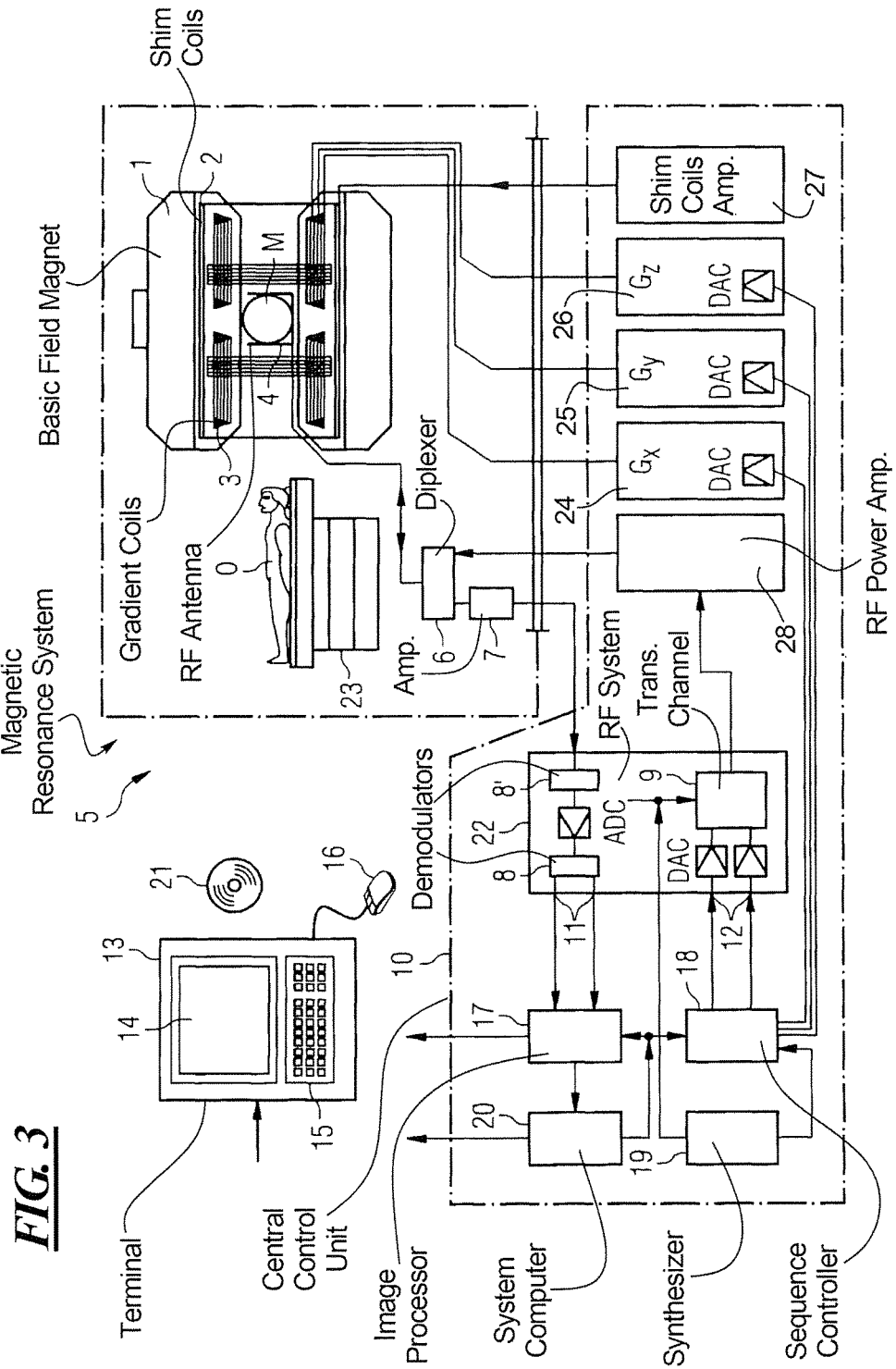
FIG. 3 schematically illustrates a magnetic resonance apparatus according to the present invention, designed to execute the method in accordance with the present invention.

FIG. 1 is a schematic representation of a magnetic resonance system 5 (a magnetic resonance imaging or magnetic resonance tomography apparatus). A basic field 1 magnet generates a temporally constant, strong magnetic field for polarization or, respectively, alignment of the nuclear spins in a volume segment of a subject O, for example a part of a human body that is to be examined, which body (lying on a table 23) is examined in the magnetic resonance system 5. The high homogeneity of the basic magnetic field that is required for nuclear magnetic resonance measurement is defined in a typically spherical measurement volume M in which the parts of the human body that are to be examined are arranged. Components are known as shim plates made of ferromagnetic material are attached at suitable points to assist the homogeneity requirements, and in particular to eliminate temporally invariable influences. Temporally variable influences are eliminated by shim coils 2, operated by a shim coils amplifier 27.

A cylindrical gradient coil system 3 which consists of three sub-windings is used in the basic field magnet 1. Each sub-winding is supplied with current by an amplifier to generate a linear (and temporally variable) gradient field in the respective direction of the Cartesian coordinate system. The first sub-winding of the gradient field system 3 thereby generates a gradient $G_x$ in the x-direction; the second sub-winding generates a gradient $G_y$ in the y-direction; and the third sub-winding generates a gradient $G_z$ in the z-direction. The amplifier comprises a digital/analog converter that is activated by a sequence controller 18 for time-accurate generation of gradient pulses.

One or more radio-frequency antennas 4 which convert the radio-frequency pulses emitted by a radio-frequency power amplifier into an alternating magnetic field for excitation of the nuclei and alignment of the nuclear spins of the subject O to be examined or, respectively, of the region of the subject O that is to be examined is located within the gradient field system 3. Each radio-frequency antenna 4 consists of one or more RF transmission coils and one or more RF reception coils in the form of an annular, advantageously linear, or matrix-like arrangement of component coils. The alternating field emanating from the precessing nuclear spins—i.e. normally the nuclear spin echo signals caused by a pulse sequence made up of one or more radio-frequency pulses and one or more gradient pulses—is also converted by the RF reception coils into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are thereby digitally represented in the sequence controller 18 as a series of complex numbers based on a pulse sequence predetermined by the system computer 20. This number sequence is supplied as a real part and imaginary part to a digital/analog converter in the radio-frequency system 22 via a respective input 12 and from said digital/analog converter (DAC) to a transmission channel 9. In the transmission channel 9, the pulse sequences are modulated on a radio-frequency carrier signal whose base frequency corresponds to the center frequency, and the modulated signal is emitted from an RF power amplifier 28.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The correspondingly acquired magnetic resonance signals are phase-sensitively demodulated on an intermediate frequency in an acquisition channel 8' (first demodulator) of the radio-frequency system 22 of the radio-frequency system 22 and digitized in an analog/digital converter (ADC). This signal is further demodulated on a frequency of 0. The demodulation on a frequency of 0 and the separation into real part and imaginary part occurs in a second demodulator 8 after the digitization in the digital domain. An MR image or three-dimensional image data set is reconstructed by the image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 thereby controls the time-accurate switching of the gradients, the emission of the radio-frequency pulses with defined phase amplitude and the reception of the magnetic resonance signals. The time base for the radio-frequency system 22 and the sequence controller 18 is provided by a synthesizer 19. The selection of corresponding control programs (stored on a DVD 21, for example) to generate an MR image and the presentation of the generated MR image take place via a terminal 13 that has a keyboard 15, a mouse 16 and a monitor 14.

Figure 4:
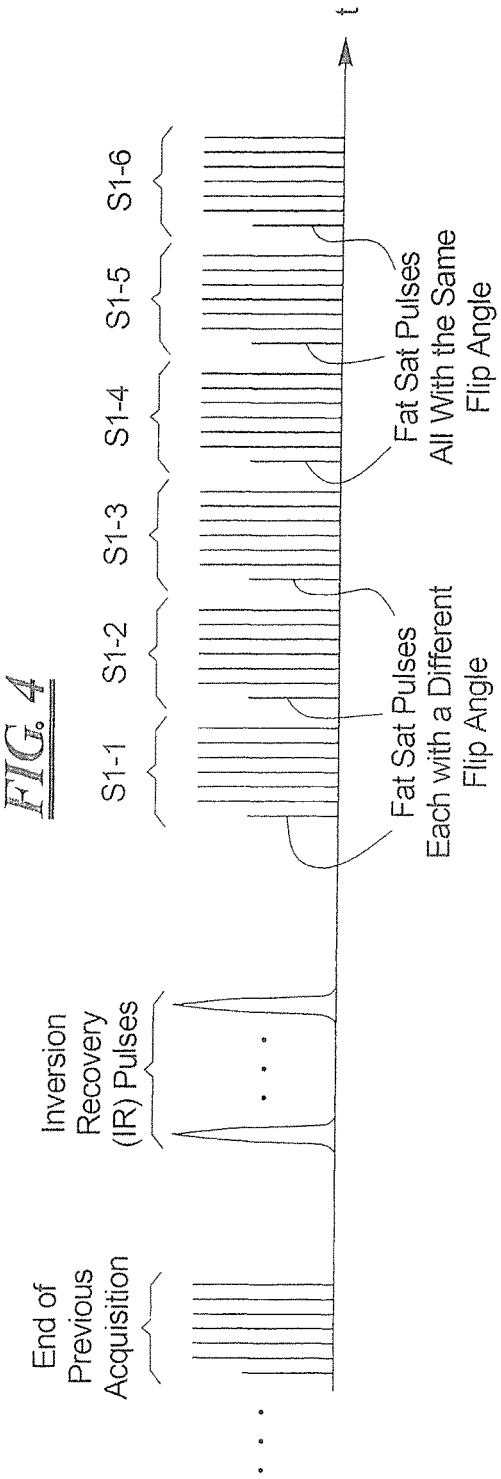
FIG. 4 schematically illustrates a data acquisition protocol in accordance with the present invention for explaining a first embodiment of the present invention.
Figure 5:
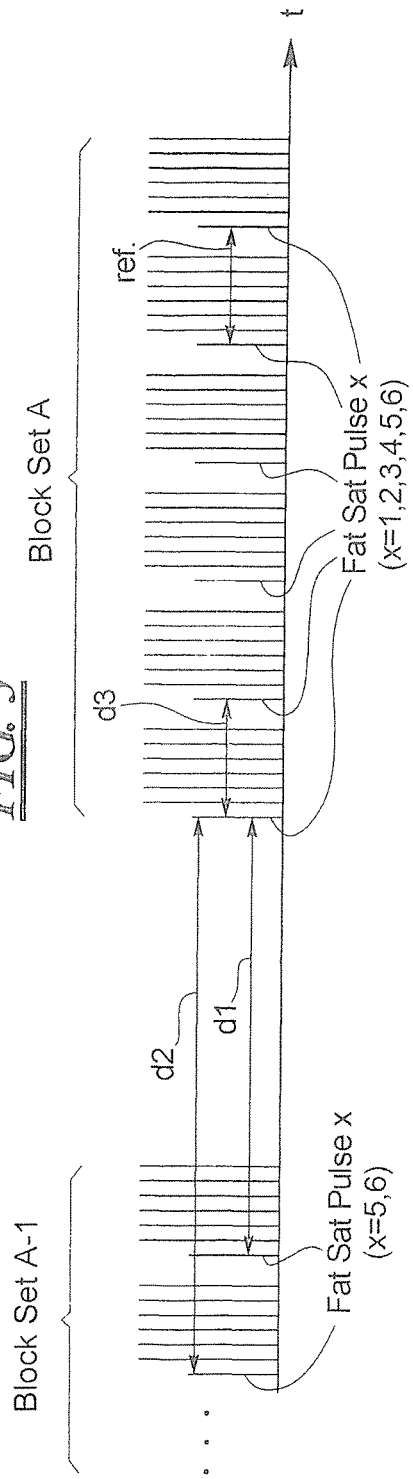
FIG. 5 schematically illustrates a data acquisition protocol in accordance with the present invention for explaining a second embodiment of the present invention.

The magnetic resonance apparatus shown in FIG. 5 is designed to operate according to any number of known imaging protocols (operating sequences), including a sequence in accordance with the invention, as shown in different embodiments in FIGS. 4 and 5.

In the embodiment shown in FIG. 4, after the end of a previous acquisition, inversion recovery (IR) pulses are radiated, and thereafter another series of data acquisitions of slices S1-1 through S1-6 (in this example) takes place. Prior to each acquisition, a fat saturation (FatSat) pulse is radiated that has the purpose of saturating nuclear spins of fat in the data acquisition region. In accordance with the present invention, in the embodiment shown in FIG. 4, the first three FatSat pulses, respectively for the first three slice acquisitions, have different flip angles. The next three FatSat pulses in the sequence of six acquisitions can then be the same as the last FatSat pulse of the first three FatSat pulses.

It is also possible for more than the first three FatSat pulses to have respectively different flip angles.

The flip angle variation can be performed in several ways. For example, a linear ramp can be used so that the respective FatSat pulses have flip angles of 180°, 170°, 160°, 150°, 140°, and another pulse at 140°.

Alternatively, a quadratic decrement can be used, so that the successive FatSat pulses can have respective flip angles of 180°, 164°, 155°, 151°, 149°, 148°, and any subsequent FatSat pulses can then remain with a flip angle of 148°.

Another alternative is to make use of a defined mathematical function Flip Angle=f(x).

A further embodiment is shown in FIG. 5, wherein the flip angle variation depends on the time (distance) of a FatSat pulse in question with respect to a previous FatSat pulse. The flip angle, or flip angle decrement, of the FatSat pulse can be weighted by this time or distance.

As an example, as shown in FIG. 5, a distance dl can be determined, which is the time between the pulse x=1 of Block Set A to the last pulse x=6 of the previous Block Set A-1. Similarly, a determination can be made of the time d2 between the pulse x=1 of Block Set A to the penultimate pulse x=5 of Block Set A-1. A time can also be determined that is the time between the pulse x=2 of Block Set A and the first pulse x=1 of the same Block Set A. Moreover, a reference time can be determined which, in this example, is the time REF. between pulses x=5 and x=6 of Block Set A.

In a first version of the flip angle weighting in accordance with the invention, the weighting can be calculated as a weighting factor for the pulse x=1 that is d1/REF.

In another embodiment, the weighting factor for the pulse x=1 can be calculated as (d1+d2)/to 2REF. The weighting factor for the pulse x=2 can then be calculated as the sum of the time between pulse x=2 of Block A and pulse x=6 of Block A-1, and d3, divided by 2REF.

In general, the invention is based on the application of variable FatSat pulses being radiated during a single magnetic resonance data acquisition block.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance data from an examination subject using an acquisition sequence that includes at least one acquisition sequence, comprising:

operating a magnetic resonance data acquisition unit to read out magnetic resonance data from a plurality of slices in a stack in the examination subject, in a readout block set comprised of a readout block for each of said slices in the stack;

preceding each readout block of said readout block set, radiating one saturation pulse that saturates nuclear spins of fat in a respective slice of the examination subject from which the magnetic resonance data in the respective readout block are readout;
operating the magnetic resonance data acquisition unit to radiate the respective saturation pulses with varying flip angles in at least three of said readout blocks that occur in succession in said acquisition sequence, to give the respective saturation pulses of said at least three readout blocks respectively different flip angles that decrease from a largest flip angle for a first-occurring of said at least three readout blocks, to a smallest flip angle for a last-occurring of said at least three readout blocks; and
operating the magnetic resonance data acquisition unit, also in said acquisition sequence, to radiate the respective saturation pulses in at least two further readout blocks, other than said at least three of said readout blocks, respectively with equal flip angles.

2. A method as claimed in claim 1 comprising decreasing said flip angle according to a monotonically decreasing mathematical function.

3. A method as claimed in claim 1 comprising repeating said acquisition sequence multiple times, and varying the respective flip angles of the saturation pulses of said at least three readout blocks dependent on a duration between a saturation pulse of a current acquisition sequence, and a saturation pulse of an immediately preceding acquisition sequence.

4. A method as claimed in claim 3 comprising setting a flip angle of a saturation pulse in a current acquisition cycle to be larger when a longer duration elapses between said saturation pulse and an immediately preceding saturation pulse.

5. A method as claimed in claim 1 comprising operating said magnetic resonance data acquisition unit to acquire magnetic resonance data in multiple, successive acquisition sequences, with a first of said multiple acquisition cycles occurring chronologically before a second of said multiple acquisition cycles, and wherein a time interval, which is larger than a time interval of two readout blocks of a readout block set, being situated between a chronologically last readout block of the readout block set of the first acquisition sequence and the chronologically first readout block of the readout block set of the second acquisition sequence.

6. A magnetic resonance apparatus comprising:
a magnetic resonance data acquisition unit;
a control unit configured to operate the magnetic resonance data acquisition unit to execute an acquisition sequence in order to read out magnetic resonance data from a plurality of slices in a stack in the examination subject, in a readout block set comprised of a readout block for each of said slices in the stack;
said control unit being configured to operate the magnetic resonance data acquisition unit to radiate, preceding each readout block of said readout block set, one saturation pulse that saturates nuclear spins of fat in a respective slice of the examination subject from which the magnetic resonance data in the respective readout block are readout;
said control unit being configured to operate the magnetic resonance data acquisition unit to radiate the respective saturation pulses with varying flip angles in at least three of said readout blocks that occur in succession in said acquisition sequence, to give the respective saturation pulses of said at least three readout blocks respectively different flip angles that decrease from a largest flip angle for a first-occurring of said at least three readout blocks, to a smallest flip angle for a last-occurring of said at least three readout blocks; and
said control unit being configured to operate the magnetic resonance data acquisition unit, also in said acquisition sequence, to radiate the respective saturation pulses in at least two further readout blocks, other than said at least three of said readout blocks, respectively with equal flip angles.

7. A non-transitory, computer-readable data storage medium encoded with programming instructions, said data storage medium being loaded into a computerized control unit of a magnetic resonance apparatus that also comprises a magnetic resonance data acquisition unit, said programming instructions causing said computerized control unit to:
operating the magnetic resonance data acquisition unit to execute an acquisition sequence in order to read out magnetic resonance data from a plurality of slices in a stack in the examination subject, in a readout block set comprised of a readout block for each of said slices in the stack;
operate the magnetic resonance data acquisition unit to radiate, preceding each readout block of said readout block set, one saturation pulse that saturates nuclear spins of fat in a respective slice of the examination subject from which the magnetic resonance data in the respective readout block are readout;
operate the magnetic resonance data acquisition unit to radiate the respective saturation pulses with varying flip angles in at least three of said readout blocks that occur in succession in said acquisition sequence, to give the respective saturation pulses of said at least three readout blocks respectively different flip angles that decrease from a largest flip angle for a first-occurring of said at least three readout blocks, to a smallest flip angle for a last-occurring of said at least three readout blocks; and
operate the magnetic resonance data acquisition unit, also in said acquisition sequence, to radiate the respective saturation pulses in at least two further readout blocks, other than said at least three of said readout blocks, respectively with equal flip angles.

* * * * *